(12) United States Patent
Schultz

(10) Patent No.: US 11,881,393 B2
(45) Date of Patent: Jan. 23, 2024

(54) CROSS FIELD EFFECT TRANSISTOR LIBRARY CELL ARCHITECTURE DESIGN

(71) Applicant: Advanced Micro Devices, Inc., Santa Clara, CA (US)

(72) Inventor: Richard T. Schultz, Ft. Collins, CO (US)

(73) Assignee: Advanced micro devices, inc., Santa Clara, CA (US)

( * ) Notice: Subject to any disclaimer, the term of this patent is extended or adjusted under 35 U.S.C. 154(b) by 0 days.

(21) Appl. No.: 17/489,316

(22) Filed: Sep. 29, 2021

(65) Prior Publication Data

US 2023/0096037 A1    Mar. 30, 2023

(51) Int. Cl.
 *H01L 27/12*      (2006.01)
 *H01L 21/84*      (2006.01)
 *H01L 29/06*      (2006.01)
 *H01L 27/092*     (2006.01)

(52) U.S. Cl.
 CPC .......... *H01L 27/1203* (2013.01); *H01L 21/84* (2013.01); *H01L 27/092* (2013.01); *H01L 29/0673* (2013.01)

(58) Field of Classification Search
 CPC . H01L 27/1203; H01L 21/84; H01L 27/1104; H01L 29/785; H01L 29/1033
 USPC .............................................. 257/66; 438/149
 See application file for complete search history.

(56) References Cited

U.S. PATENT DOCUMENTS

| | | | |
|---|---|---|---|
| 6,549,987 B1 | 4/2003 | Rappoport et al. | |
| 8,645,893 B1 | 2/2014 | Yeung et al. | |
| 9,275,721 B2 | 3/2016 | Chen et al. | |
| 9,575,891 B2 | 2/2017 | Riley et al. | |
| 2019/0319021 A1 | 10/2019 | Xu et al. | |
| 2020/0098859 A1 | 3/2020 | Reboh et al. | |
| 2020/0105761 A1 | 4/2020 | Liaw | |
| 2020/0135740 A1* | 4/2020 | Liaw | ................... H01L 27/1104 |
| 2022/0093503 A1 | 3/2022 | Wuu et al. | |

(Continued)

FOREIGN PATENT DOCUMENTS

DE    102020106252 A1    10/2020
WO      2021125138 A1     6/2021

OTHER PUBLICATIONS

Schultz, Richard T., U.S. Appl. No. 17/489,252, entitled "Cross FET SRAM Cell Layout", filed Sep. 29, 2021, 45 pages.

(Continued)

*Primary Examiner* — Thinh T Nguyen
(74) *Attorney, Agent, or Firm* — Kowert, Hood, Munyon, Rankin & Goetzel, P.C.; Rory D. Rankin

(57) ABSTRACT

A system and method for efficiently creating layout for memory bit cells are described. In various implementations, cells of a library use Cross field effect transistors (FETs) that include vertically stacked gate all around (GAA) transistors with conducting channels oriented in an orthogonal direction between them. The channels of the vertically stacked transistors use opposite doping polarities. A first category of cells includes devices where each of the two devices in a particular vertical stack receive a same input signal. The second category of cells includes devices where the two devices in a particular vertical stack receive different input signals. The cells of the second category have a larger height dimension than the cells of the first category.

7 Claims, 16 Drawing Sheets

(56) References Cited

U.S. PATENT DOCUMENTS

2022/0093504 A1 3/2022 Schultz et al.
2022/0302111 A1 9/2022 Wu et al.
2022/0310634 A1 9/2022 Sakai

OTHER PUBLICATIONS

Non-Final Office Action in U.S. Appl. No. 17/489,252, dated Dec. 28, 2022, 10 pages.
International Search Report and Written Opinion in International Application No. PCT/US2022/076215, dated Jan. 2, 2023, 13 pages.

* cited by examiner

Standard Cell Layout 700

N-type Nanosheet 702

N-type Gate 704

N-type Local Interconnect 312

Gate Contact 318

N-type Contact 320

US 11,881,393 B2

CROSS FIELD EFFECT TRANSISTOR LIBRARY CELL ARCHITECTURE DESIGN

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, short channel effects such as at least leakage currents, and processing yield are some issues which affect the placement of devices and the routing of signals across an entire die of a semiconductor chip. These issues have the potential to delay completion of the design and affect the time to market.

In order to shorten the design cycle for semiconductor chips, manual full-custom designs are replaced with automation where possible. In some cases, a standard cell layout is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, pin access, and so on. Therefore, designers manually create these cells to achieve better results for the multiple characteristics or rewrite the rules for the place-and-route tool. However, many times, the layout tools and rules still don't achieve the performance necessary for the resulting circuits without consuming an appreciable amount of power and consuming a significant amount of on-die area.

In view of the above, efficient methods and systems for creating layout for standard cells are desired.

Figure 1:
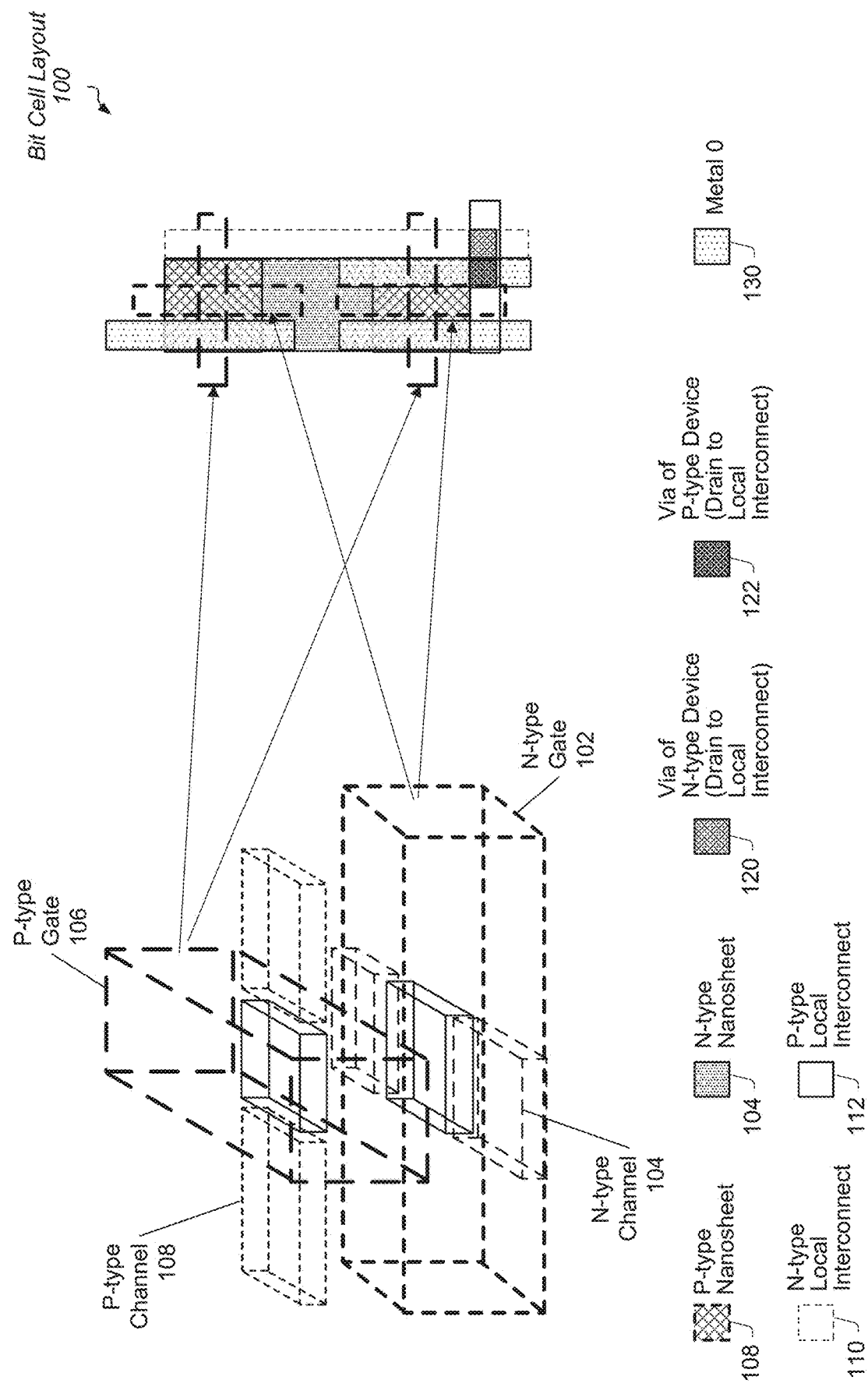
FIG. 1 is a generalized diagram of a top view of standard cell layout utilizing Cross field effect transistors (FETs).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently creating layout for memory bit cells are contemplated. In various implementations, one or more standard cells include cross field effect transistors (FETs). As used herein, "Cross FETs" are also referred to as a "XFETs." Additionally, as used herein, a "transistor" is also referred to as a "semiconductor device" or a "device." In some implementations, the Cross FETs are vertically stacked gate all around (GAA) transistors such as a top vertical GAA transistor (or GAA transistor) is formed vertically on top of a bottom GAA transistor with at least an isolating oxide layer in between the two GAA transistors. In addition, the top GAA transistor has one or more conducting channels positioned orthogonal to the one or more conducting channels of the bottom GAA transistor. Therefore, the direction of current flow of the top GAA transistor through one or more top channels is orthogonal to the direction of current flow of the one or more bottom channels of the bottom GAA transistor.

The top GAA transistor has a doping polarity of one or more top channels that is an opposite polarity of the doping polarity of one or more bottom channels of the bottom GAA transistor. For example, in an implementation, the top GAA transistor includes one or more p-type channels, whereas, the bottom GAA transistor includes one or more n-type channels. In another implementation, the p-type and n-type polarities are reversed between the one or more channels of the top GAA transistor and the bottom GAA transistor. With the orthogonal orientation between the top GAA transistor and the bottom GAA transistor, both the top and bottom GAA transistors have the maximum mobility for their respective carriers based on their orientation.

A library of standard cells includes at least two standard cells (or cells) with different heights. For example, a first cell includes a pair of transistors with channels of different doping polarities that receive two different input signals. A transistor of a first doping polarity of the pair has a greater length of a gate region than a transistor of the second doping polarity of the pair. In one example, a select control signal of a multiplexer routed in a perpendicular direction with respect to n-type metal gates of n-type devices causes the n-type metal gates to be extended to create the necessary connections within the multiplexer. The p-type device formed above (or below) this n-type device does not receive the select control signal. Therefore, within a vertical stack of Cross FETS, the two devices receive different input signals. The height dimension of this cell grows larger than the height of cells that do not have such a vertical stack of devices. When each of the p-type device and the n-type device of a particular vertical stack of Cross FETs receive the same input signal, it is unnecessary to increase the length of the gate region of either of the devices. Therefore, the library of cells has two general categories of cells. A first category of cells includes devices where each of the two devices in a particular vertical stack receive a same input signal. The second category of cells includes devices where the two devices in a particular vertical stack receive different input signals. The cells of the second category have a larger height dimension than the cells of the first category.

Turning now to FIG. 1, a generalized block diagram of a top view of a standard cell layout 100 is shown that uses Cross FETs. The standard cell layout 100 is for an inverter using Cross FETs. However, in other implementations, the characteristics and techniques used for standard cell layout 100 is used for a variety of other types of Boolean gates and complex gates. A three-dimensional (3-D) illustration of the p-type and n-type Cross FETs accompanies the layout 100. As shown, a p-type device is vertically stacked on an n-type device. The n-type device includes at least an n-type gate 102 formed all around an n-type channel 104. Similarly, a p-type gate 106 is formed all around a p-type channel 108. Therefore, the p-type channel 108 has a doping polarity that is an opposite polarity of the n-type channel 104 of the bottom n-type device. Although a single n-type channel 104 and a single p-type channel 108 is shown, in other implementations, the semiconductor devices include another number of channels. In some implementations, the channel is a lateral nanowire. In other implementations, the channel is a nanosheet.

The n-type channel 104 and the n-type gate 102 are oriented in an orthogonal direction to the p-type channel 108 and the p-type gate 106. In other words, the n-type channel 104 and the n-type gate 102 are oriented in a direction that is 90 degrees from a direction of the p-type channel 108 and the p-type gate 106. Therefore, the direction of current flow of the bottom n-type device through the n-type channel 104 is orthogonal to the direction of current flow of the p-type channel 108 of the top p-type device. With the orthogonal orientation between the top p-type device and the bottom n-type device, both devices have the maximum mobility for their respective carriers based on their orientation. In addition, the orthogonal orientation of the top p-type device and the bottom n-type device allow connections between the vertically stacked devices to use a single via layer.

In the standard cell layout 100, the metal zero layer (M0 or Metal0) 130 is the top-most layer. A gate contact would be a next vertically highest layer, but the gate contacts are not shown for ease of illustration. The p-type gate 106 is the next vertically highest layer followed by the p-type nanosheet 108, which creates the p-type channel. Insulating layers are between the top p-type device and the bottom n-type device with a gate contact formed between the devices in the insulating layers. This gate contact is not shown with the aerial top view provided by the standard cell layout 100 (or layout 100). Cross-section views of standard cell layout are provided later. The gate contact between the vertically stacked devices is directly connected to the p-type metal gate 106 and the n-type metal gate 102 without traversing any metal layers.

The via (or contact) 122 of the p-type device connects the drain region of the p-type device to local interconnect 112 of the p-type device. The via (or contact) 120 of the n-type device connects the drain region of the n-type device to local interconnect 110 of the n-type device. The vertically stacked devices of the layout 100 consumes less on-die area. The use of a single via layer reduces resistance and capacitance of the circuit. Compared to Fin FETs, the use of gate all around (GAA) nanowires or nanosheets provides lower threshold voltages, faster switching times, less leakage currents, and further reduction of short channel effects. Examples of short channel effects other than leakage current are latchup effects, drain-induced barrier lowering (DIBL), punchthrough, performance dependency on temperature, impact ionization, and parasitic capacitance to the silicon substrate and to the wells used for the source and drain regions.

One advantage of the orthogonal orientation of the Cross FETs in the layout 100 includes a single via layer. In contrast, Complementary FETs (CFETs) use multiple metal layers and multiple via layers to make connections between vertically stacked devices. Gaining access to the source and drain regions of the bottom device of Cross FETs is easier than compared with CFETs. Another advantage of the orthogonal orientation of the Cross FETs in the layout 100 is use of the maximum mobility of each of the carriers in each device of the vertically stacked devices.

Figure 2:
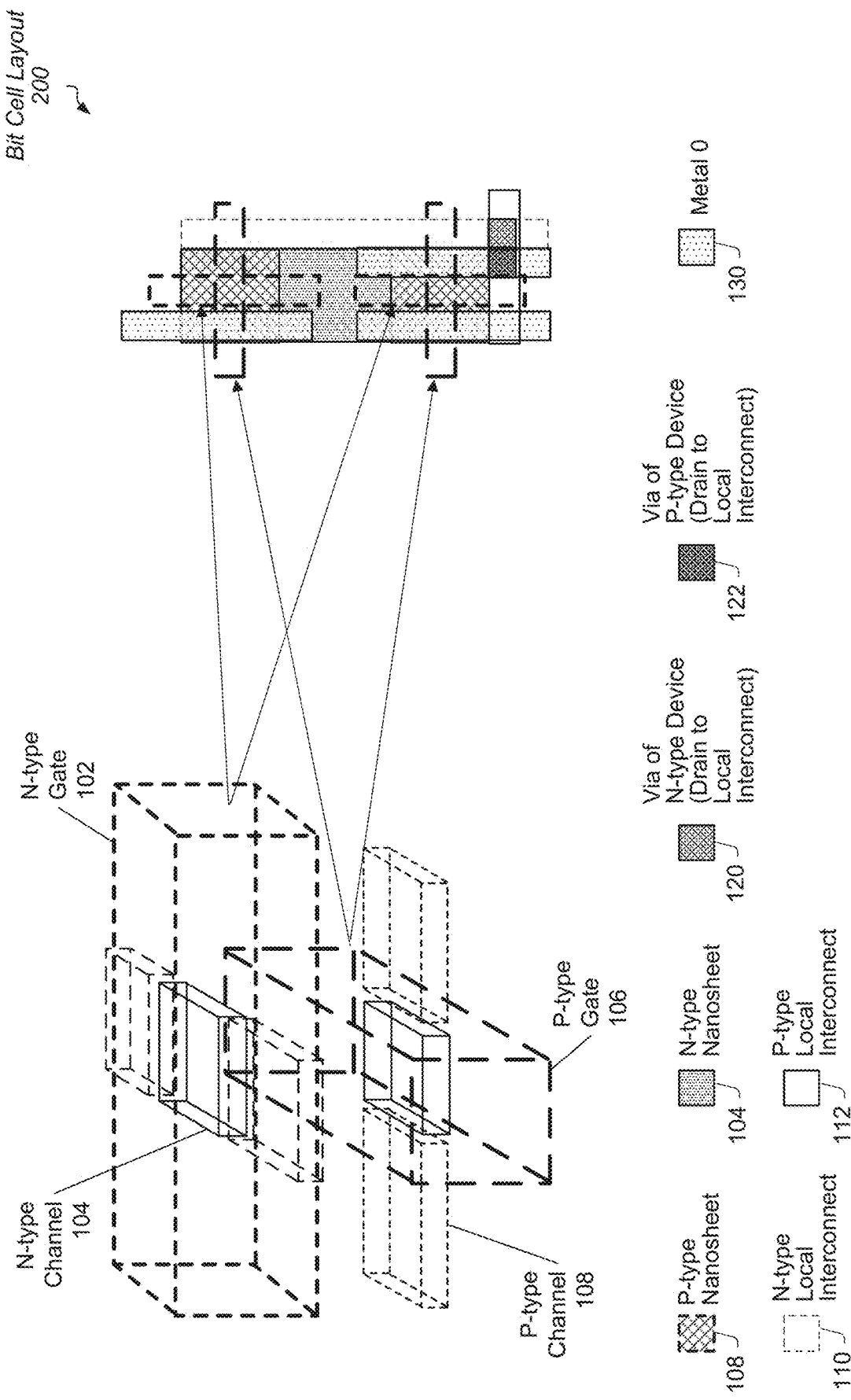
FIG. 2 is a generalized diagram of a top view of standard cell layout utilizing Cross FETs.

Turning now to FIG. 2, a generalized block diagram of a top view of a standard cell layout 200 is shown. The standard cell layout 200 is for a 2-input Boolean NAND gate using Cross FETs. A three-dimensional (3-D) illustration of the p-type and n-type Cross FETs accompanies the layout 200. Contacts (or vias), materials and structures described earlier are numbered identically. As shown, an n-type device is vertically stacked on a p-type device. Similar to the layout 100, in other implementations, the Cross FETs of the layout 200 use multiple n-type channels 104 and multiple p-type channels 108. Similar to the layout 100, the layout 200 uses an orthogonal orientation between the n-type channel 104 and the p-type channel 108, and uses a single via layer to create connections between the vertically stacked devices.

In contrast to Fin field effect transistors (Fin FETs), where a Fin of doped silicon has physical contact with the silicon substrate, the channels of vertical GAA devices do not have physical contact with the silicon substrate. Generally, when compared to Fin FETs, GAA transistors provide lower threshold voltages, faster switching times, less leakage currents, and further reduction of short channel effects. In some implementations, a channel of doped silicon of the GAA transistor is a nanowire. In other implementations, a channel of doped silicon of the GAA transistor is a nanosheet. A nanosheet is a sheet of doped silicon, rather than a wire of doped silicon. In other words, the nanosheet is a wider and thicker conductive wire than a lateral nanowire. The nanosheet can also be considered as a Fin that is rotated and placed on its side vertically above the silicon substrate such that the nanosheet does not have physical contact with the silicon substrate. Rather, metal gate is formed between the nanosheet and the silicon substrate. This visualization, though, does not describe the actual fabrication steps for forming the nanosheet.

Vertically stacking a top GAA transistor on top of a bottom GAA transistor further increases performance, reduces power consumption, reduces on-die area consumed by the GAA transistors, and further reduces short channel effects. Complementary FETs (CFETs) include a top GAA transistor vertically stacked on top of a bottom GAA transistor with at least an oxide layer in between for isolation. However, CFETs uses a top GAA transistor with one or more channels aligned in a same direction as the one or more channels of the bottom GAA transistor. As shown earlier, Cross FETs, though, have an orthogonal orientation between the one or more channels of the top GAA transistor and the one or more channels of the bottom GAA transistor. Compared to Complementary FETs, Cross FETs have better mobility for each of the top GAA transistor and the bottom GAA transistor, which leads to higher performance. Complementary FETs use two metal layers and three via layers to create connections between the top GAA transistor and the bottom GAA transistor. In contrast, Cross FETs utilize a single metal layer and a single via layer for connections between the top and bottom GAA transistors. Cross FETs have the bottom GAA transistor formed in a first wafer while the top GAA transistor is formed in a second wafer using conventional semiconductor fabrication steps. The first wafer and the second wafer are connected to one another through a hybrid bond process, which increases yield.

Figure 3:
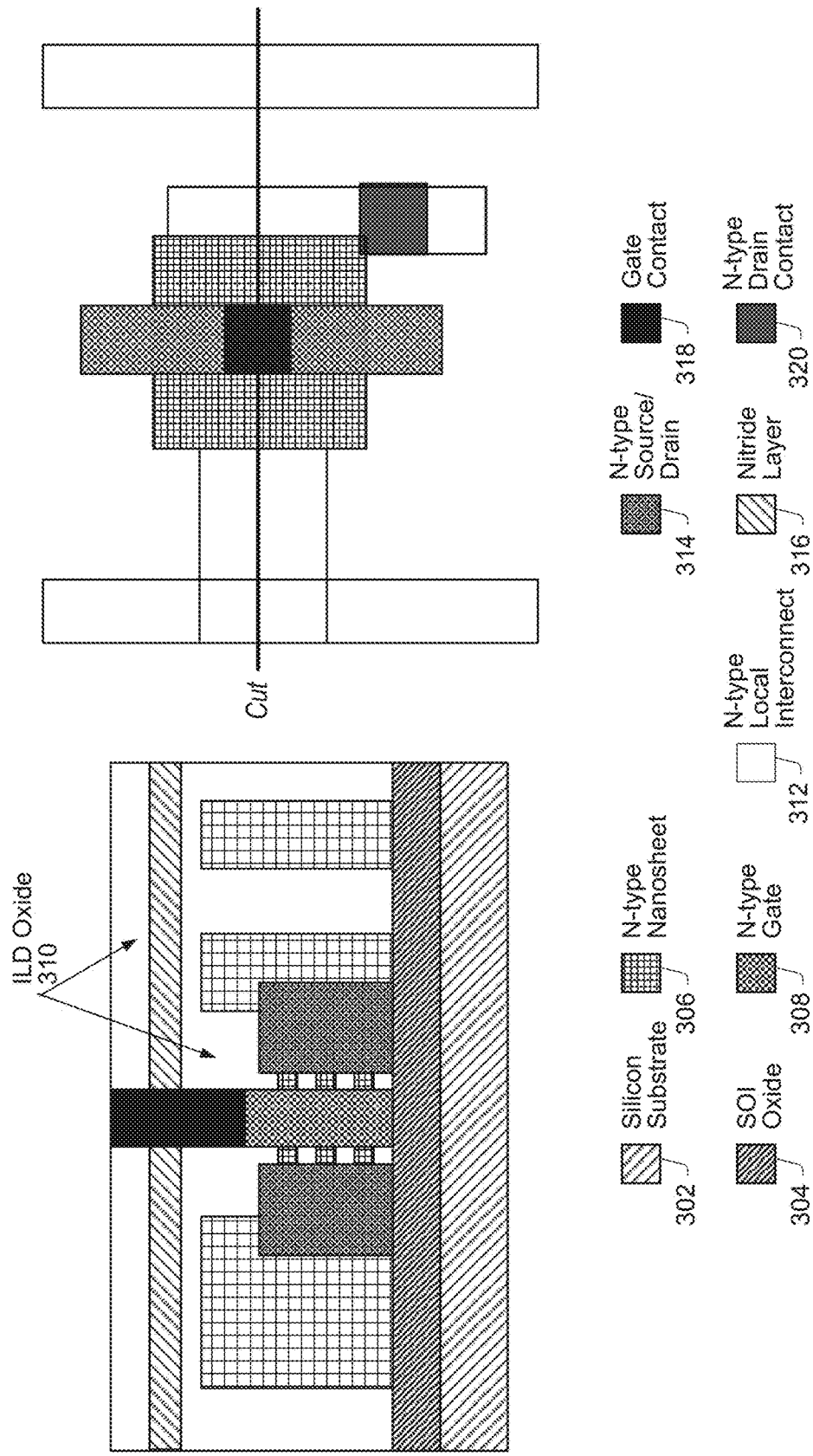
FIG. 3 is a generalized diagram of a top view of standard cell layout utilizing Cross FETs.
Figure 4:
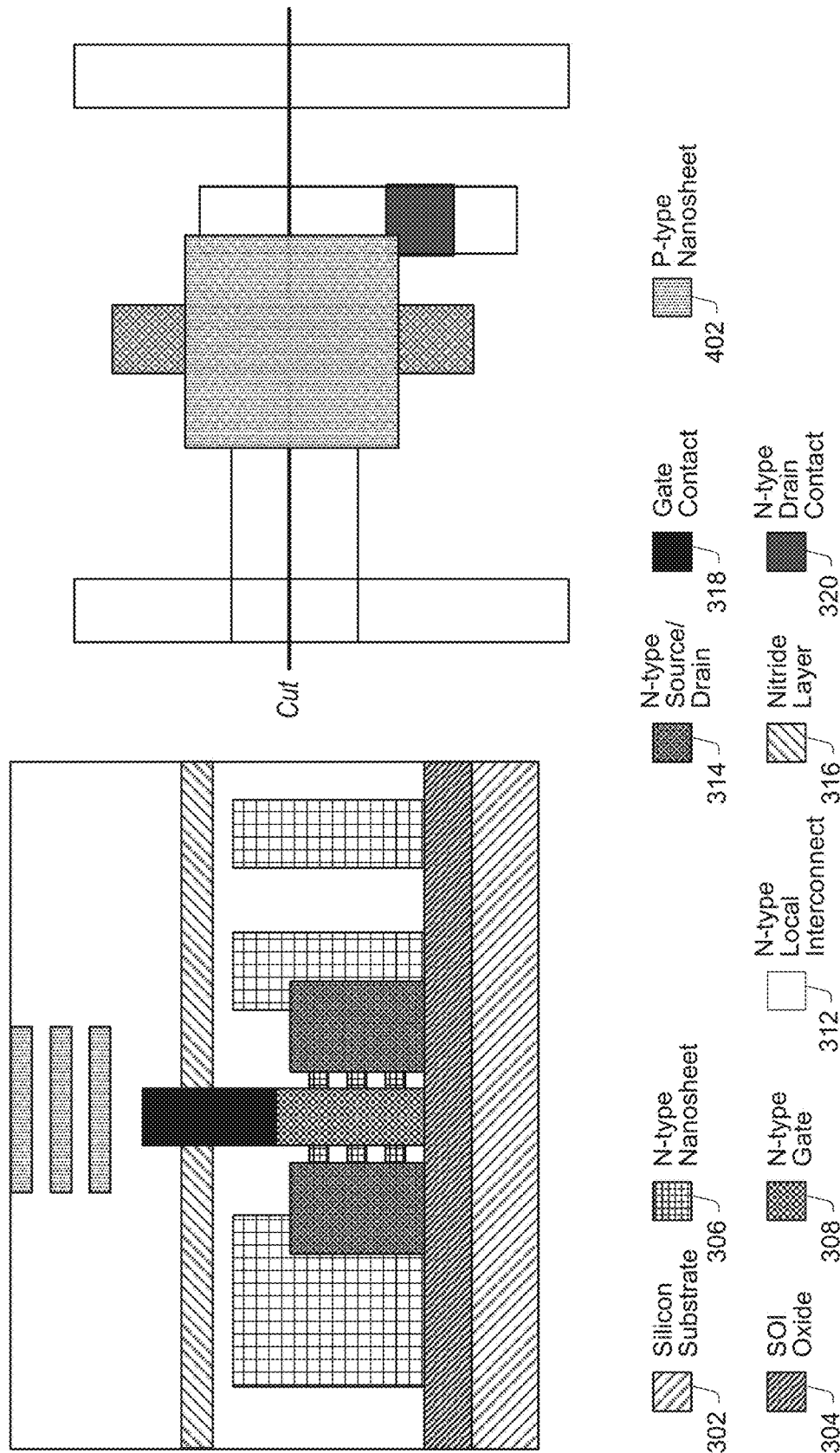
FIG. 4 is a generalized diagram of a top view of standard cell layout utilizing Cross FETs.
Figure 5:
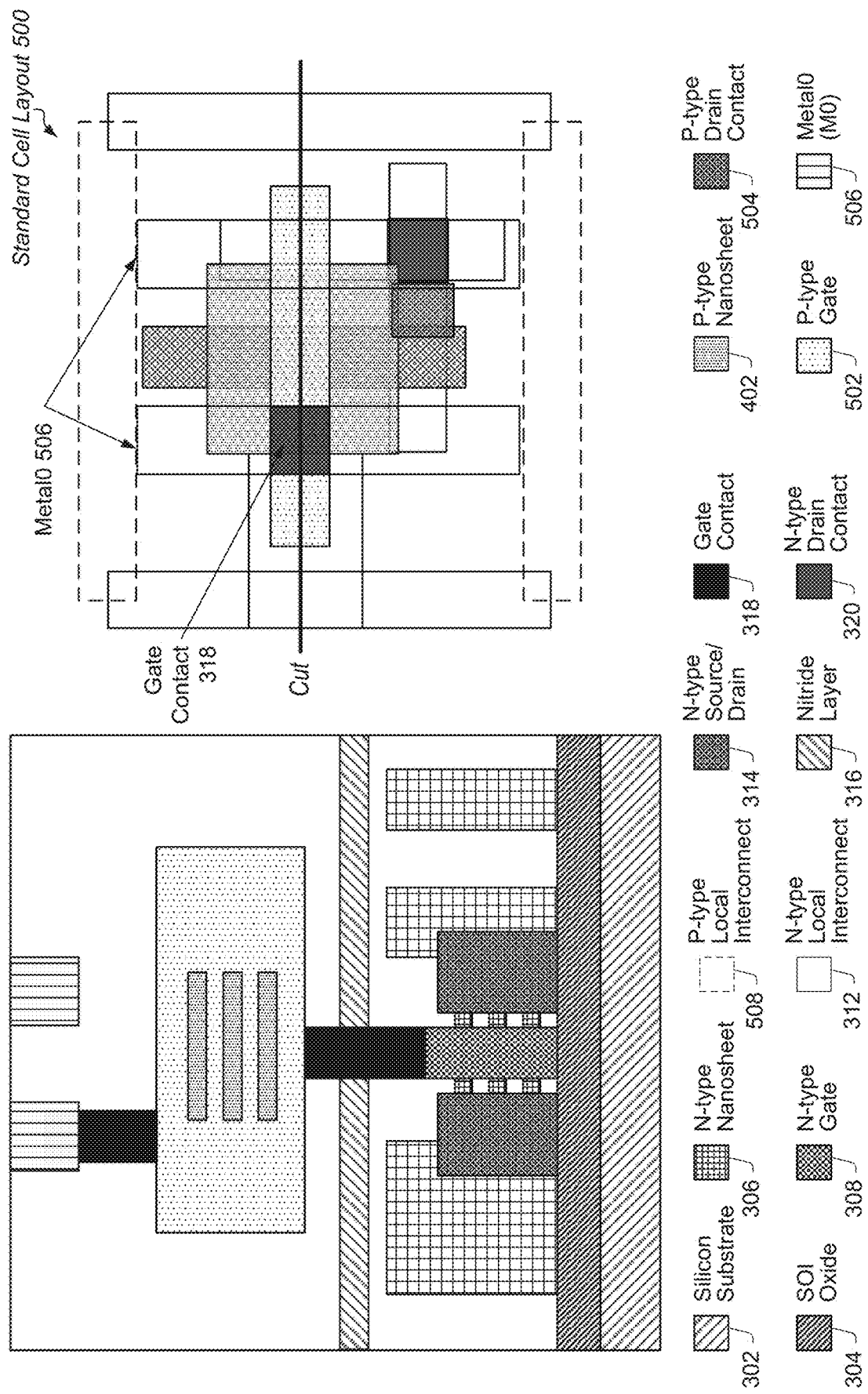
FIG. 5 is a generalized diagram of a top view of standard cell layout utilizing Cross FETs.
Figure 6:
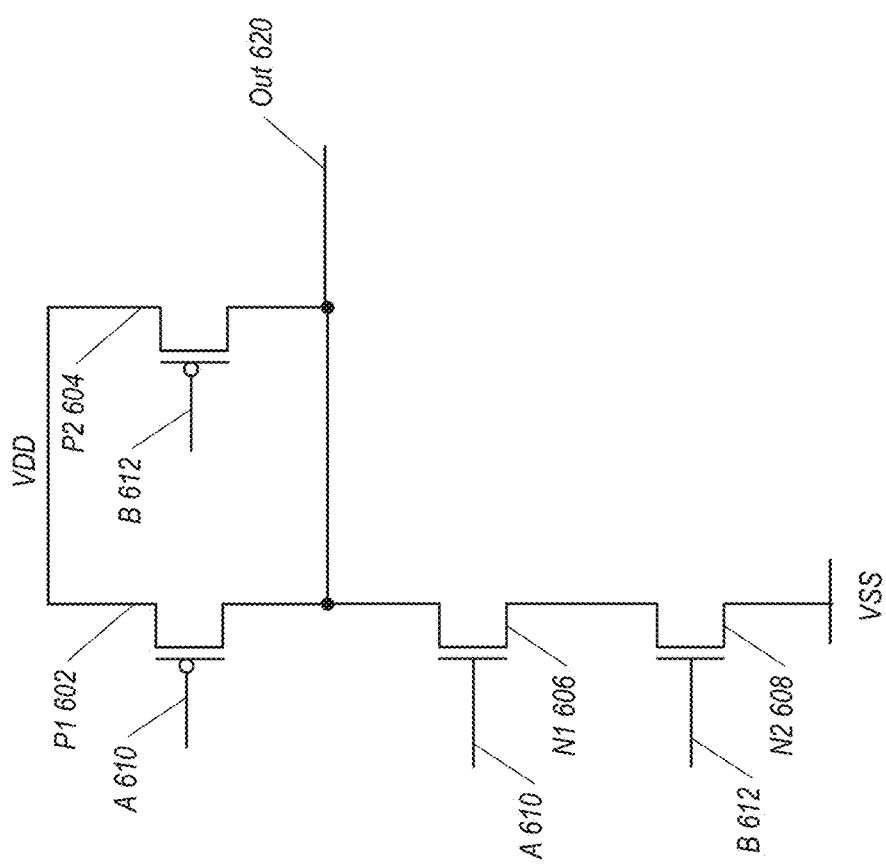
FIG. 6 is a generalized diagram of a schematic of a Boolean logic gate.

In the following description, layout techniques for forming an inverter are shown in FIGS. 3-5. These techniques are also used for forming a six transistor (6T) random access data storage of a memory bit cell that consumes a planar area above a silicon substrate of four transistors. This memory bit cell that uses Cross FETs is used in a memory bank as shown in FIG. 6. The layout techniques for forming the 6T random access data storage of the memory bit cell are shown in FIGS. 7-15.

Turning now to FIG. 3, a generalized block diagram of a top view of a standard cell layout 300 is shown. The top view of the layout 300 is shown on the right, and the cross-sectional view is shown on the left. For this inverter, a p-type device is being vertically stacked on an n-type device. However, in other implementations, it is possible and contemplated to have an n-type device vertically stacked on a p-type device. Each of the devices of the inverter uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Here, in layout 300, a silicon on insulator (SOI) oxide layer 304 is deposited on the silicon substrate 302. In various implementations, the SOI oxide layer 304 is a silicon dioxide (SiO2) layer. The semiconductor device fabrication process is building a local silicon on insulator (SOI) which insulates the body of the device from the silicon substrate 302. In an implementation, the formed SOI oxide layer 304 is relatively thick. A stack of channels is formed over the SOI oxide layer 304. In an implementation, the stack of channels are n-type nanosheets 306. Gate metal material 308 is deposited followed by CMP steps to polish the gate metal 308. In various implementations, titanium nitride (TiN) is used for the gate metal 308. The gate metal 308 is provided all around the n-type nanosheets 306 in a 360-degree manner. An interlayer dielectric (ILD) oxide layer 310 is deposited around the gate region.

The n-type source and drain regions 314 are formed. In an implementation, the n-type source and drain regions 314 are epitaxially grown silicon doped with Phosphorous. Afterward, the n-type local interconnect 312 is formed. In some implementations, n-type local interconnect 312 includes the tungsten, cobalt, ruthenium, or molybdenum. A silicon nitride layer 316 and additional ILD oxide 310 are formed on the initial ILD oxide 310 layer. For example, a silicon nitride (SiNx) layer 316 is deposited on the ILD oxide 310 layer. The chemical and electrical properties of amorphous hydrogenated silicon nitride (SiNx) make this material a good candidate for an insulating layer in integrated circuits. Each of the nitride layer 316 and the ILD oxide 310 layer are etched to create space for the gate contact 318. Similarly, the nitride layer 316 and the ILD oxide 310 layer are etched to create space for the drain contact 320. The gate contact 318 and the drain contract 320 are deposited in the created spaces.

Referring to FIG. 4, a generalized block diagram of a top view of a standard cell layout 400 is shown. Contacts (or vias), materials and other layout elements described earlier are numbered identically. The standard cell layout 400 (or layout 400) on the right is a continuation of the semiconductor processing steps being performed on the layout 300 for an inverter using Cross FETs. A cross-sectional view of the semiconductor layers used in the layout 400 also accompanies the layout 400 and it is shown on the left. A stack of channels is formed over the n-type gate contact 318 in the ILD oxide layer 310. In an implementation, the stack of channels are p-type nanosheets 402. In some implementations, a separate wafer has alternating layers grown such as a silicon germanium semiconducting epitaxial growth layer alternating with a silicon semiconducting epitaxial growth layer. The separate wafer with the alternating layers is bonded to the top of ILD oxide layer 310 of the layout 300 (of FIG. 3). In other implementations, the alternating layers are grown on top of ILD oxide layer 310 of the layout 300 followed by one of the earlier named processes for etching the layers to the size of the p-type nanosheets 402. The earlier named processes were described in relation to forming the n-type nanosheets 306.

Turning now to FIG. 5, a generalized block diagram of a top view of a standard cell layout 500 is shown. Contacts (or vias), materials and other layout elements described earlier are numbered identically. The standard cell layout 500 (or layout 500) on the right is a continuation of the semiconductor processing steps being performed on the layout 400 for creating an inverter using Cross FETs. A cross-sectional view of the semiconductor layers used in the layout 500 also accompanies the layout 500 and it is shown on the left. The ILD oxide 310 layer is etched to create space for the p-type gate 502, which is placed all around the p-type nanosheets 402. Similarly, the ILD oxide 310 layer is etched to create space for the drain contact 504. The gate contact 318 and the drain contract 504 are deposited in the created spaces. Here, a metal zero layer (or metal0 or Metal 0 or M0) 506 is deposited for creating further connections for the inverter. It is noted that the metal zero layer 506 is also referred to by different names in order to maintain a convention of using the metal zero layer as a horizontal layer such as in the next layer up.

Turning to FIG. 6, a generalized block diagram of one implementation of a schematic of a Boolean NAND logic gate 600 is shown. In the implementation shown, the Boolean NAND logic gate 600 (or logic gate 600) receives two input signals indicated as A 610 and B 612, and generates an output signal indicated as Out 620. The logic gate 600 uses two p-type devices P1 602 and P2 604 connected in a parallel configuration. The logic gate 600 also uses two n-type devices N1 606 and N2 608 connected in a series configuration. The logic gate 600 is an example of a transistor schematic of a type of cell that uses Cross FETs where devices of a vertical stack receive a same input signal. For example, each of the p-type device P1 602 and the n-type device N1 606 receives the input signal A 610. Similarly, each of the p-type device P2 604 and the n-type device N2 608 receives the input signal B 612.

A semiconductor fabricated circuit of the logic gate 600 includes the p-type device P1 602 and the n-type device N1 606 in a same vertical stack. The semiconductor fabricated circuit of the logic gate 600 also includes the p-type device P2 604 and the n-type device N2 608 in a same vertical stack. For each vertical stack, the corresponding devices receive a same input signal. Therefore, it is unnecessary for the devices to have extended gate regions to complete the internal connections of the fabricated circuit of the logic gate 600. An inverter and the logic gate 600 are two examples of several examples of cells of this type.

As used herein, a Boolean logic high level is also referred to as a logic high level. Similarly, a Boolean logic low level is also referred to as a logic low level. In various implementations, the logic high level is equal to a power supply reference voltage level and the logic low level is equal to a ground reference voltage level. As used herein, a circuit node or line is "asserted" when the node or line stores a voltage level that enables a transistor that receives the voltage level, or the voltage level indicates an operation is enabled. For example, an n-type transistor is enabled when the n-type transistor receives a positive non-zero voltage level on its gate terminal that is at least a threshold voltage above a voltage level on its source terminal.

As used herein, the circuit node or line is "negated" when the node or line stores a voltage level that disables a transistor that receives the voltage level. An n-type transistor is disabled when the n-type transistor receives a voltage level on its gate terminal that is within a threshold voltage of a voltage level on its source terminal. Similarly, a p-type transistor is enabled when the p-type transistor receives a voltage level on its gate terminal that is at least a threshold voltage below a voltage level on its source terminal. The p-type transistor is negated when the p-type transistor receives a voltage level on its gate terminal that is within a threshold voltage of a voltage level on its source terminal. Additionally, operations are enabled and disabled based on corresponding control signals being asserter or negated.

When either of the input signals A 610 and B 612 has a logic low level, a corresponding one of the p-type devices P1 602 and P2 604 is enabled and generates a logic high level for the output signal Out 620. Otherwise, when both of the input signals A 610 and B 612 have a logic high level, each of the n-type devices N1 606 and N2 608 is enabled and generates a logic low level for the output signal Out 620.

Figure 7:
FIG. 7 is a generalized diagram of a top view of layout of a Boolean logic gate utilizing Cross FETs.
Figure 7:
Figure 7:
Figure 7:
Figure 7:
Figure 7:
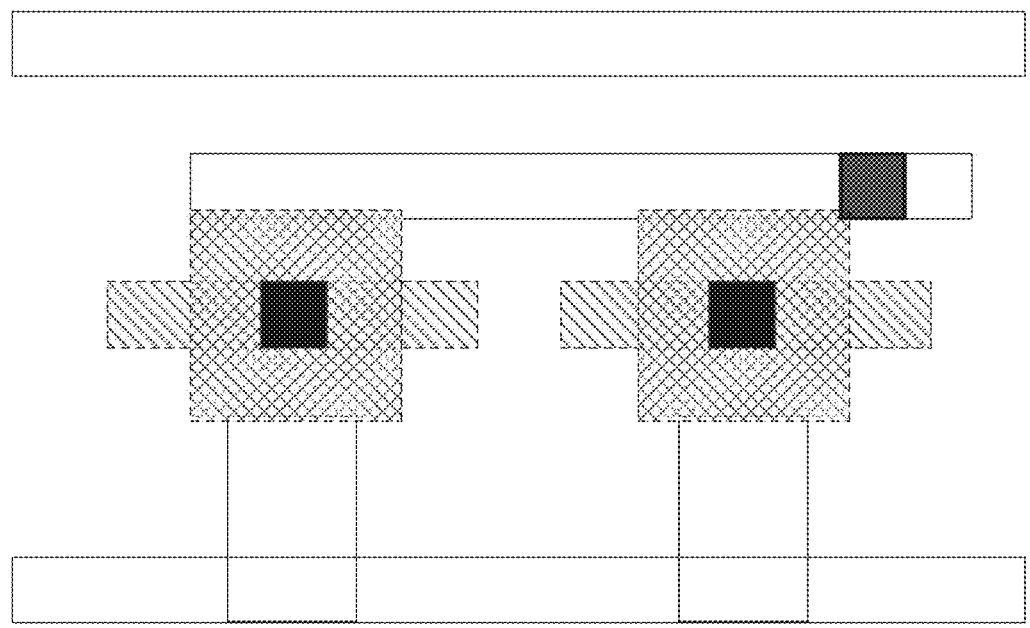
Figure 8:
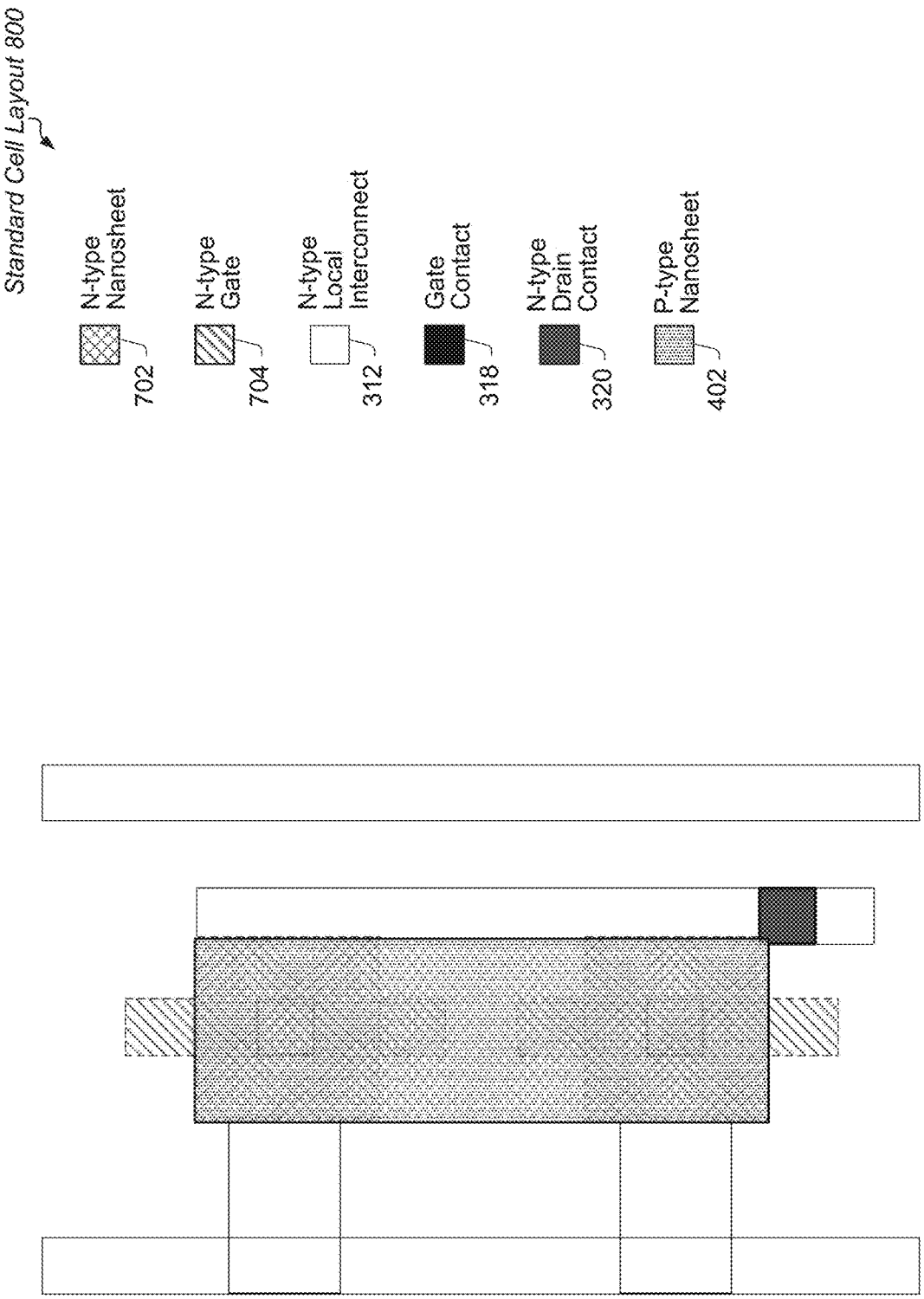
FIG. 8 is a generalized diagram of a top view of layout of a Boolean logic gate utilizing Cross FETs.
Figure 9:
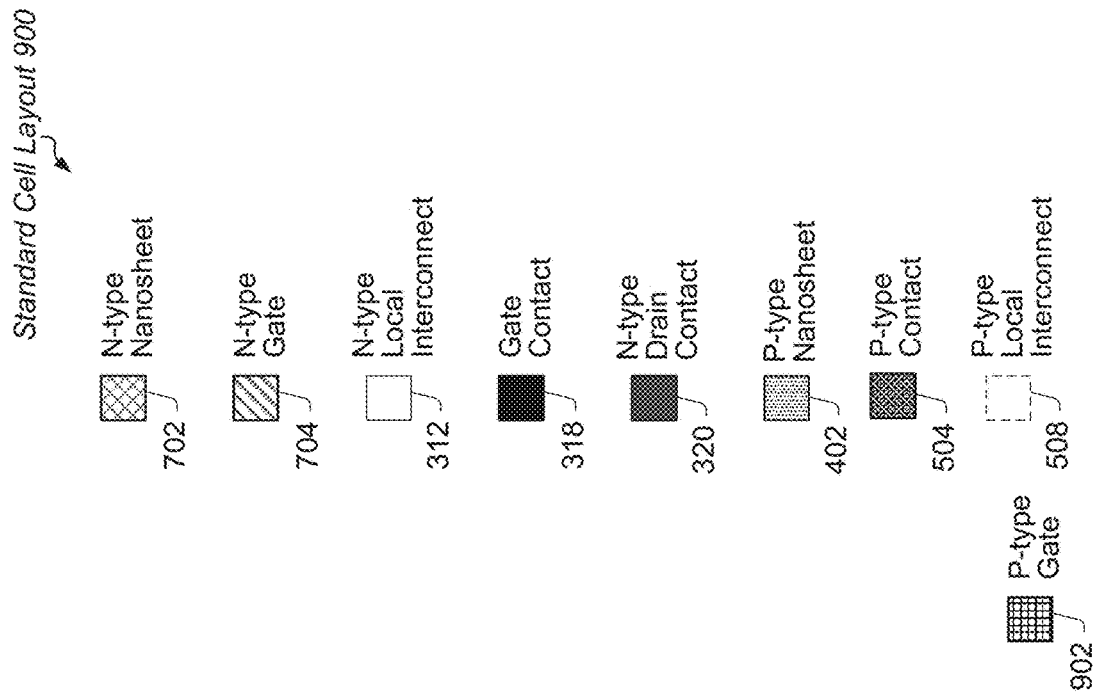
FIG. 9 is a generalized diagram of a top view of layout of a Boolean logic gate utilizing Cross FETs.
Figure 9:
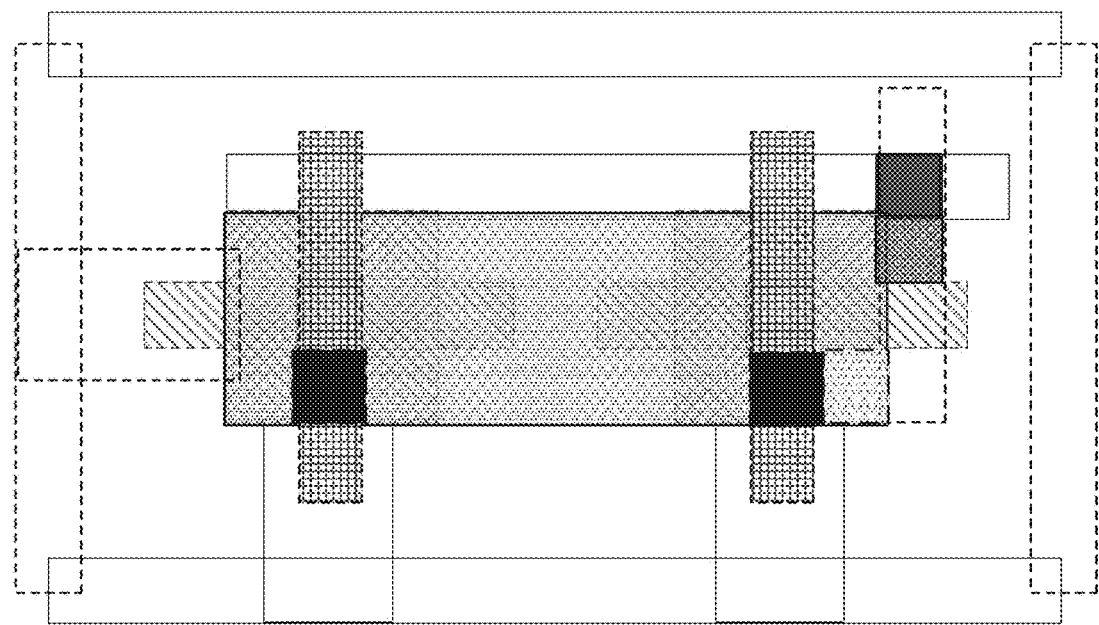
Figure 10:
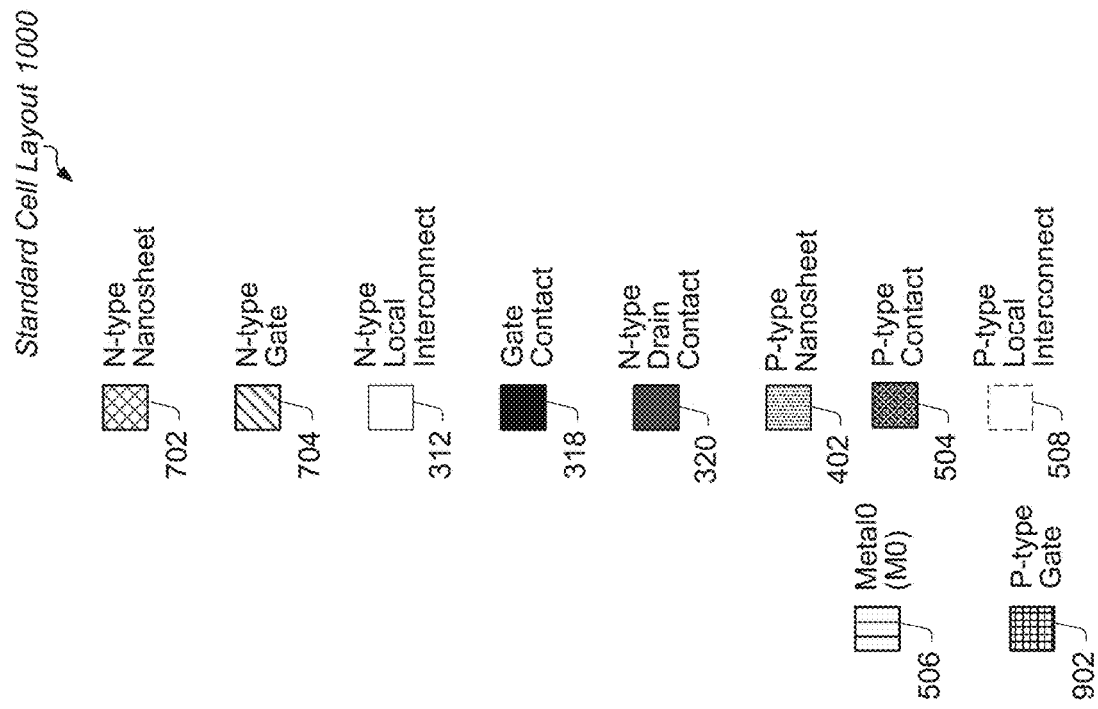
FIG. 10 is a generalized diagram of a top view of layout of a Boolean logic gate utilizing Cross FETs.
Figure 10:
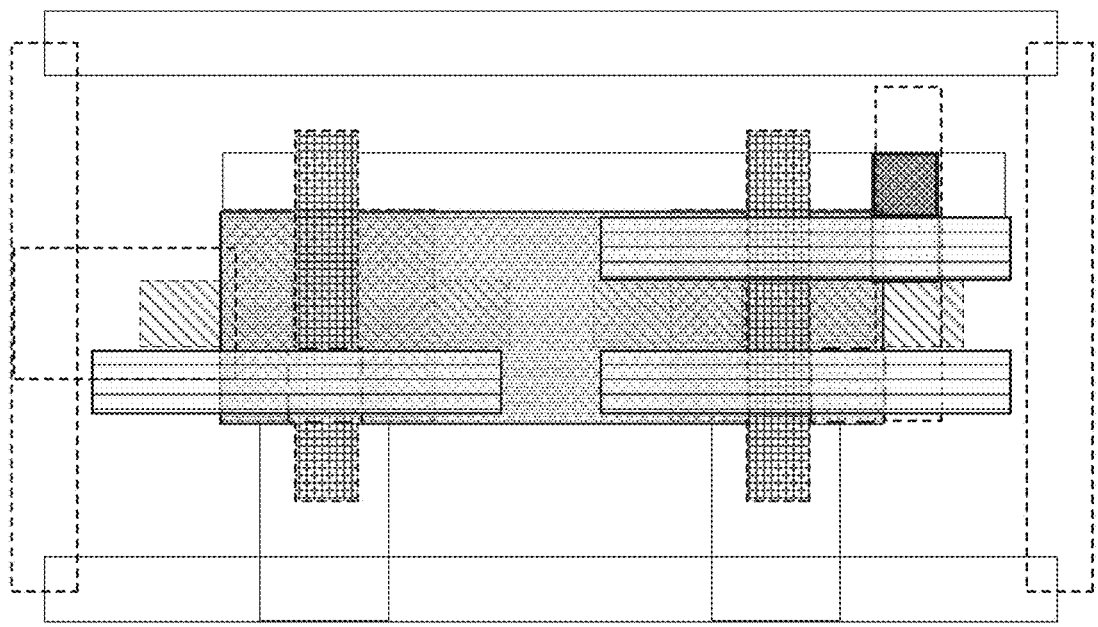

In the following description, the layout 700 (of FIG. 7) describe steps for forming layout of the n-type devices of the logic gate 600, whereas, the layout 800-1000 (of FIGS. 8-10) describe steps for forming layout of the p-type devices of the logic gate 600. Contacts (or vias), materials and other layout elements described earlier are numbered identically in FIGS. 7-10. Turning now to FIG. 7, a generalized block diagram of a top view of layout 700 of the logic gate 600 is shown. For this layout, a p-type device is being vertically stacked on an n-type device. However, in other implementations, it is possible and contemplated to have an n-type device vertically stacked on a p-type device. Each of the devices of the inverter uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Here, in layout 700 of FIG. 7, a stack of n-type nanosheets 702, the metal gate 704, the n-type local interconnect 312, and the drain contact 320 are formed for the layout of the logic gate 600 (of FIG. 6) in a similar manner as described earlier for an inverter. In the layout 800 of FIG. 8, a stack of channels, which are p-type nanosheets 402, is formed over the n-type gate contact 318. In the layout 900 of FIG. 9, p-type gate metal material 902 is deposited. The p-type gate metal 902 is provided all around the p-type nanosheets 402 in a 360-degree manner. An interlayer dielectric (ILD) oxide layer 310 is deposited around the gate region.

Afterward, the p-type local interconnect 508 is formed. Oxide layers are etched, and the gate contact 318 is formed over the p-type metal gate 902 and the p-type contact 504 is formed over the p-type local interconnect 508. In the layout 1000 of FIG. 10, a metal zero layer (M0) 506 is deposited for creating further connections for the layout of the logic gate 600. The layout is later fabricated, and the logic gate 600 is a portion of an entire integrated circuit. It is noted that the metal gates of the layout 1000 has not been extended to create connections. However, for other cells, this extension is necessary.

Figure 11:
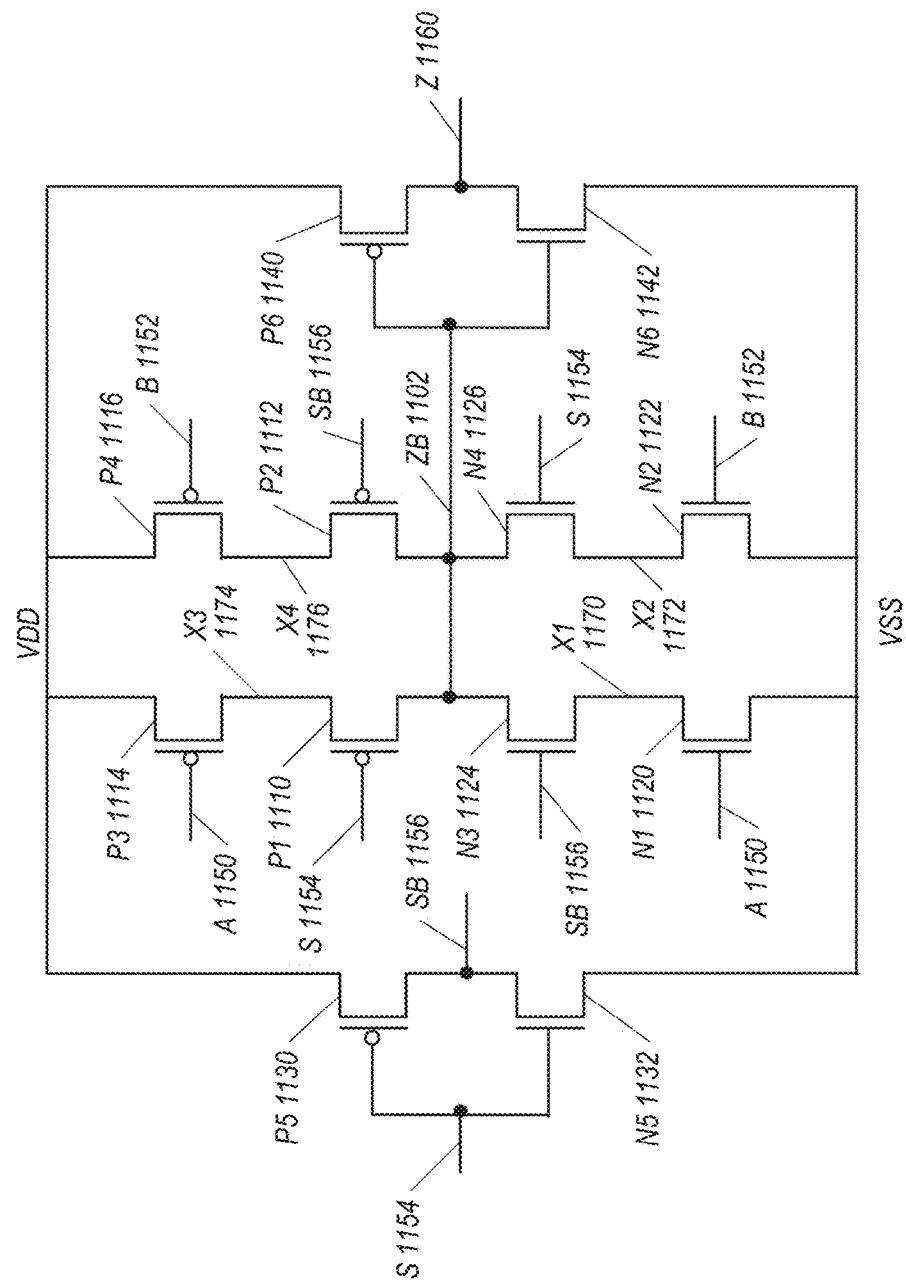
FIG. 11 is a generalized diagram of a schematic of a multiplexer gate.

Referring to FIG. 11, a generalized block diagram of one implementation of a schematic of a multiplexer gate 1100 is shown. In the implementation shown, the multiplexer gate 1100 (or mux gate 1100) receives three input signals indicated as A 1150, B 1152 and S 1154, and generates an output signal indicated as Z 1160. The mux gate 1100 uses P5 1130 and N5 1132 as an inverter that generates the signal SB 1156 from the received signal S 1154. The mux gate 1100 uses the devices P6 1140 and N6 1142 as an inverter that generates the signal Z 1160 from the received signal ZB 1102.

The P3 1114 and N1 1120 receive the input signal A 1150, the devices P4 1116 and N2 1122 receive the input signal B 1152, and the devices P1 1110 and N4 1126 receive the input signal S 1154. Additionally, the devices P2 1112 and N3 1124 receive the internally generated signal SB 1156. The devices 1110-1126 are connected in a configuration that provides the functionality of a multiplexer. For example, when the select input signal S 1154 is asserted, the mux gate 1100 generates a logic level on the output signal Z 1160 equivalent to the current logic level of the input signal B 1152. When the select input signal S 1154 is negated, the mux gate 1100 generates a logic level on the output signal Z 1160 equivalent to the current logic level of the input signal A 1150.

The mux gate 1100 is an example of a transistor schematic of a type of cell that uses Cross FETs where devices of a vertical stack receive different input signals. For example, a semiconductor fabricated circuit of the mux gate 1100 includes the p-type device P1 1110 and the n-type device N1 1120 in a same vertical stack. As shown, the p-type device P1 1110 receives the signal S 1154, whereas, the n-type device N1 1120 receives a different signal such as the signal A 1150. Similarly, a vertical stack that includes the pair of devices P2 1112 and N2 1122 receives different input signals.

Likewise, each of a vertical stack that includes the pair of devices P3 1114 and N3 1124 receive different signals, and a vertical stack that includes P4 1116 and N4 1126 receive different signals. Such a cell with at least one vertical stack with devices that receive different input signals has at least one extended gate region to complete the internal connections of the fabricated circuit. Therefore, the height dimension of the cell increases to being greater than a height of cells that includes vertical stacks where the corresponding devices receive a same input signal. As an example, the fabricated cell of the mux gate 1100 has a height greater than a height of a fabricate cell of the logic gate 600.

Figure 12:
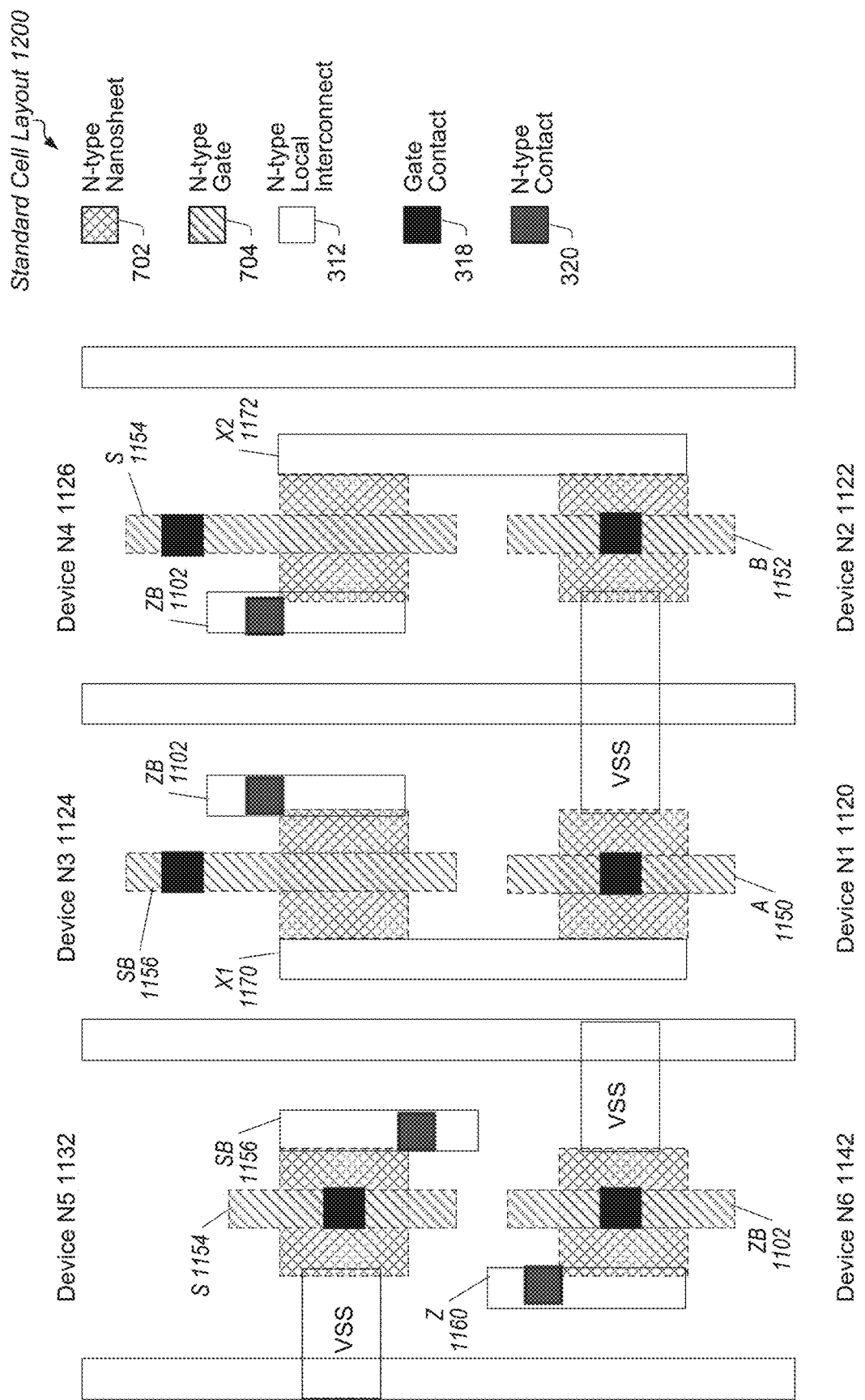
FIG. 12 is a generalized diagram of a top view of layout of a multiplexer gate utilizing Cross FETs.

In the following description, the layout 1200 (of FIG. 12) provides techniques for forming layout of the n-type devices of the mux gate 1100 (of FIG. 11), whereas, the layout 1300-1400 (of FIGS. 13-14) provide techniques for forming layout of the p-type devices of the mux gate 1100. Contacts (or vias), materials and other layout elements described earlier are numbered identically in FIGS. 12-14. Turning now to FIG. 12, a generalized block diagram of a top view of layout 1200 of the mux gate 1100 is shown. For this layout, a p-type device is being vertically stacked on an n-type device. However, in other implementations, it is possible and contemplated to have an n-type device vertically stacked on a p-type device.

Here, in layout 1200 of FIG. 12, a stack of n-type nanosheets 702, the metal gate 704, the n-type local interconnect 312, the gate contact 318, and the drain contact 320 are formed for the layout of the mux gate 1100 (of FIG. 11) in a similar manner as described earlier for an inverter and the logic gate 600. The signal names and the device names used in the mux gate 1100 for the n-type devices are shown here to aid the description of the forming of the layout. It is noted that the devices N3 1124 and N4 1126 have extended gate regions to complete the later internal connections of the fabricated circuit of the mux gate 1100.

Figure 13:
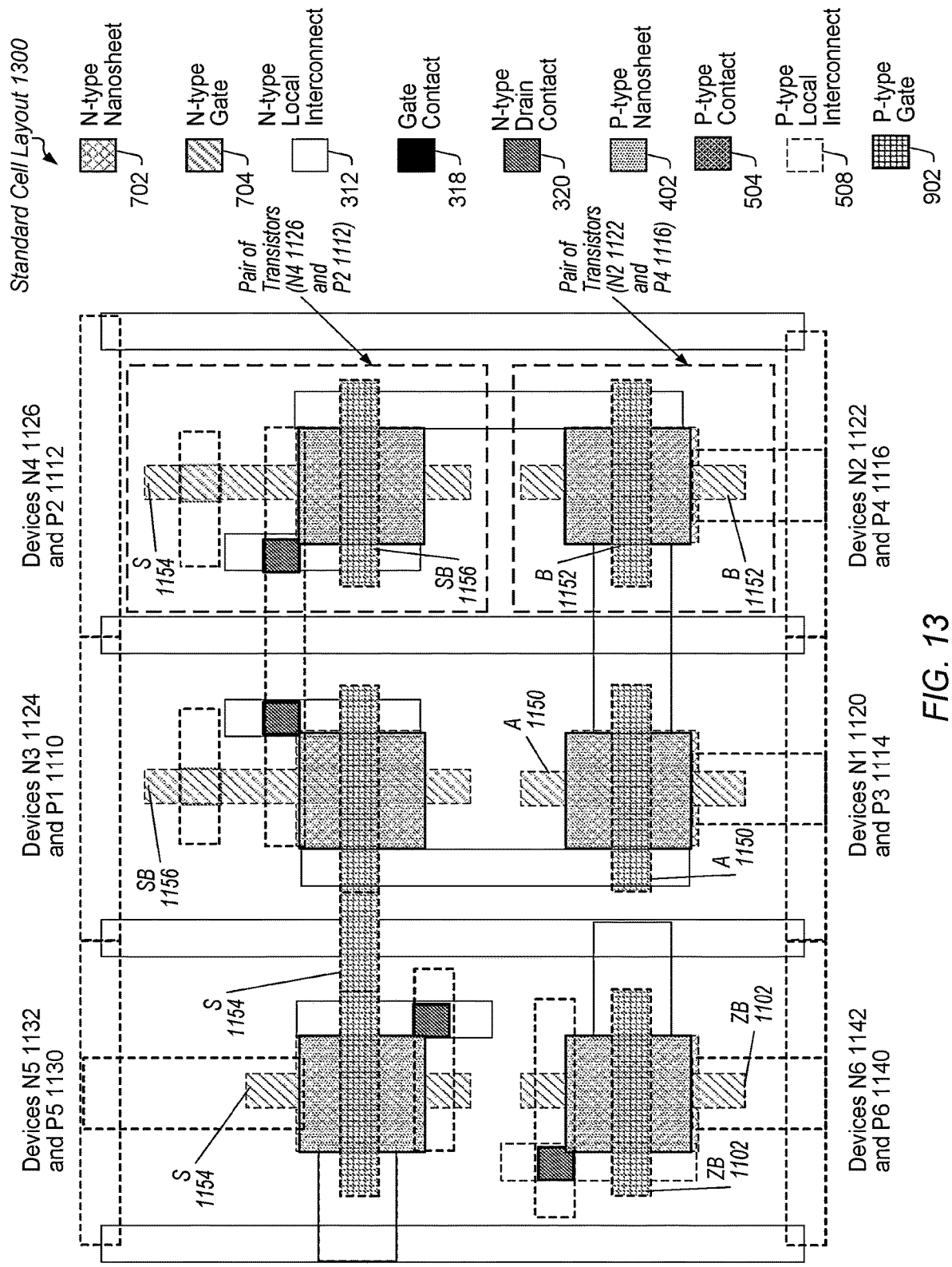
FIG. 13 is a generalized diagram of a top view of layout of a multiplexer gate utilizing Cross FETs.
Figure 14:
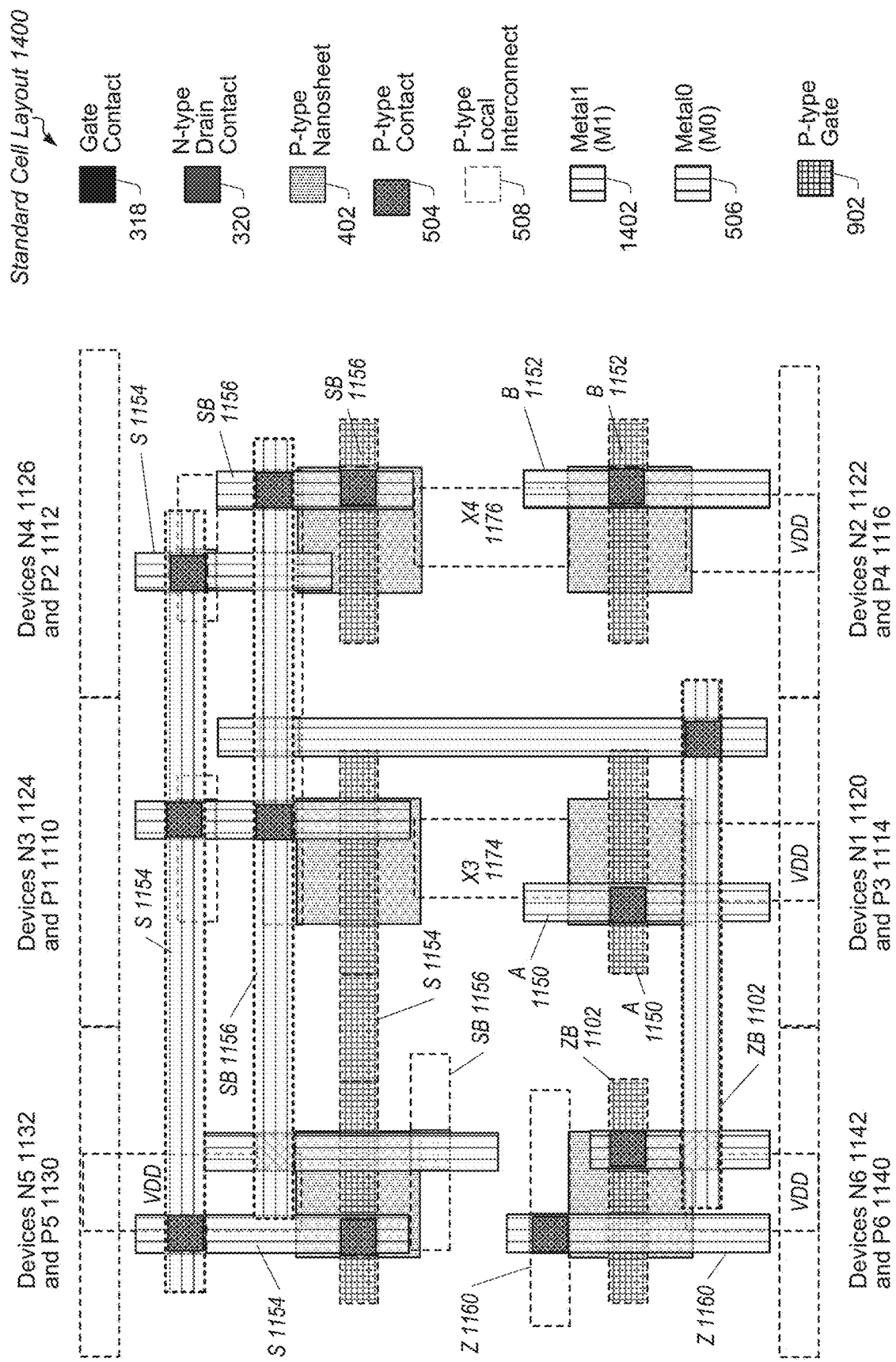
FIG. 14 is a generalized diagram of a top view of layout of a multiplexer gate utilizing Cross FETs.

In the layout 1300 of FIG. 13, the p-type nanosheets 402 are formed, the p-type gate metal material 902 is deposited, and the p-type local interconnect 508 is formed as described earlier. The signal names and the device names used in the mux gate 1100 for the p-type devices are shown here to aid the description of the forming of the layout. It is noted that the pair of devices N3 1124 and P1 1110 receive different inputs such as the input SB 1156 for the n-type device N3 1124 and the input S 1154 for the p-type device P1 1110. The gate region for the n-type device N3 1124 is extended to complete the later internal connections of the fabricated circuit of the mux gate 1100. It is also noted that the pair of devices N4 1126 and P2 1112 receive different inputs such as the input S 1154 for the n-type device N4 1126 and the input SB 1156 for the p-type device P2 1112. The gate region for the n-type device N4 1126 is extended to complete the later internal connections of the fabricated circuit of the mux gate 1100. In the layout 1400 of FIG. 14, a metal zero layer (M0) 506 and a metal one layer (M1) 1402 is deposited for creating further connections for the layout of the mux gate 1100. The layout is later fabricated, and the mux gate 1100 is a portion of an entire integrated circuit.

Figure 15:
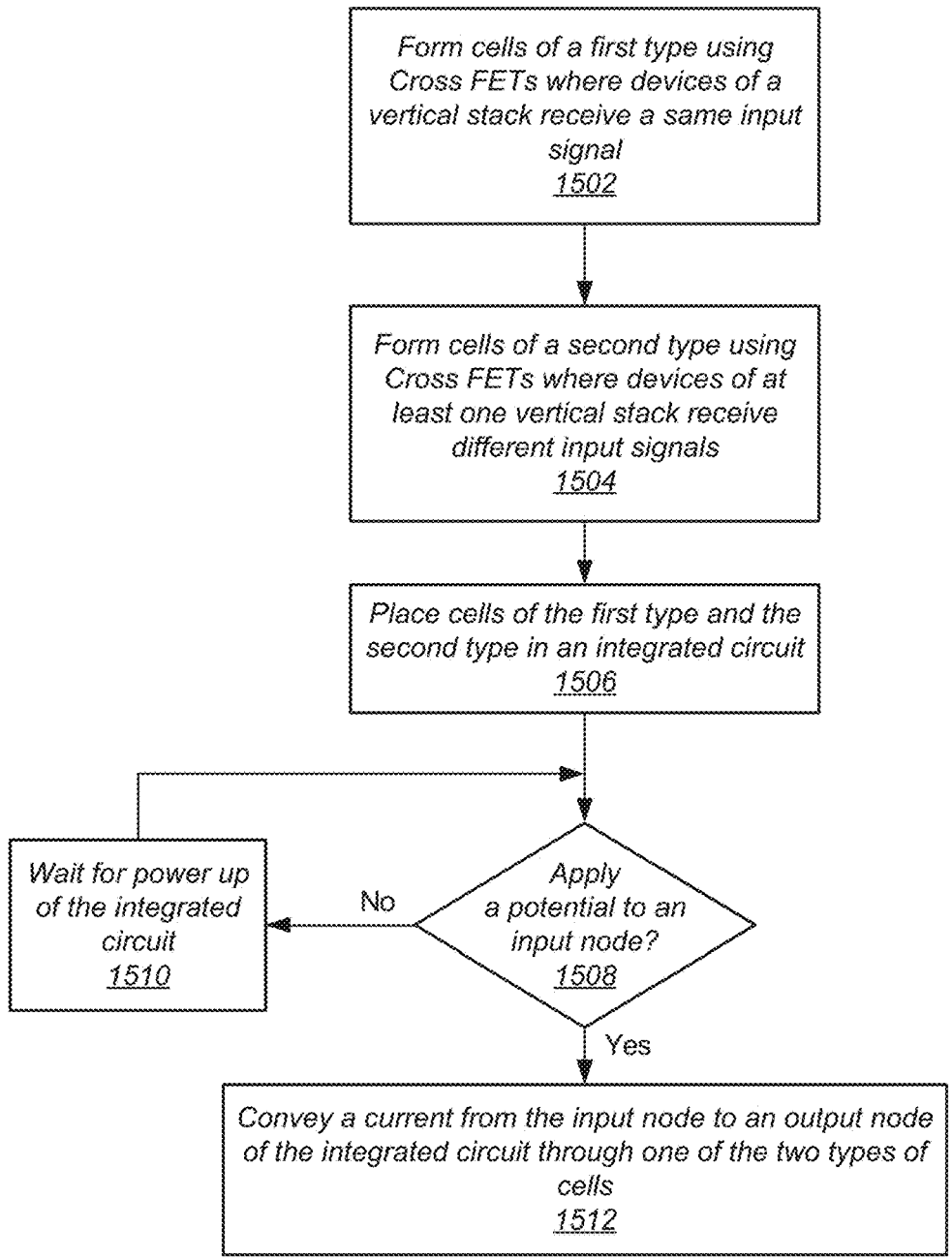
FIG. 15 is a generalized diagram of one embodiment of a method for efficiently creating layout for standard cells that utilize Cross FETs.

Referring now to FIG. 15, one embodiment of a method 1500 for efficiently creating layout for standard cells that utilize Cross FETs is shown. For purposes of discussion, the steps in this embodiment are shown in sequential order. However, in other embodiments some steps occur in a different order than shown, some steps are performed concurrently, some steps are combined with other steps, and some steps are absent.

A semiconductor fabrication process forms cells of a first type using Cross FETs where devices of a vertical stack receive a same input signal (block 1502). The semiconductor fabrication process (or process) forms cells of a second type using Cross FETs where devices of at least one vertical stack receive different input signals (block 1504). The process places cells of the first type and the second type in an integrated circuit (block 1506). If a potential is not applied to an input node of the integrated circuit ("no" branch of the conditional block 1508), then the integrated circuit waits for power up (block 1510). However, if a potential is applied to the input node of the integrated circuit ("yes" branch of the conditional block 1510), then the integrated circuit conveys a current from the input node to an output node through one of the two types of cells (block 1512).

Figure 16:
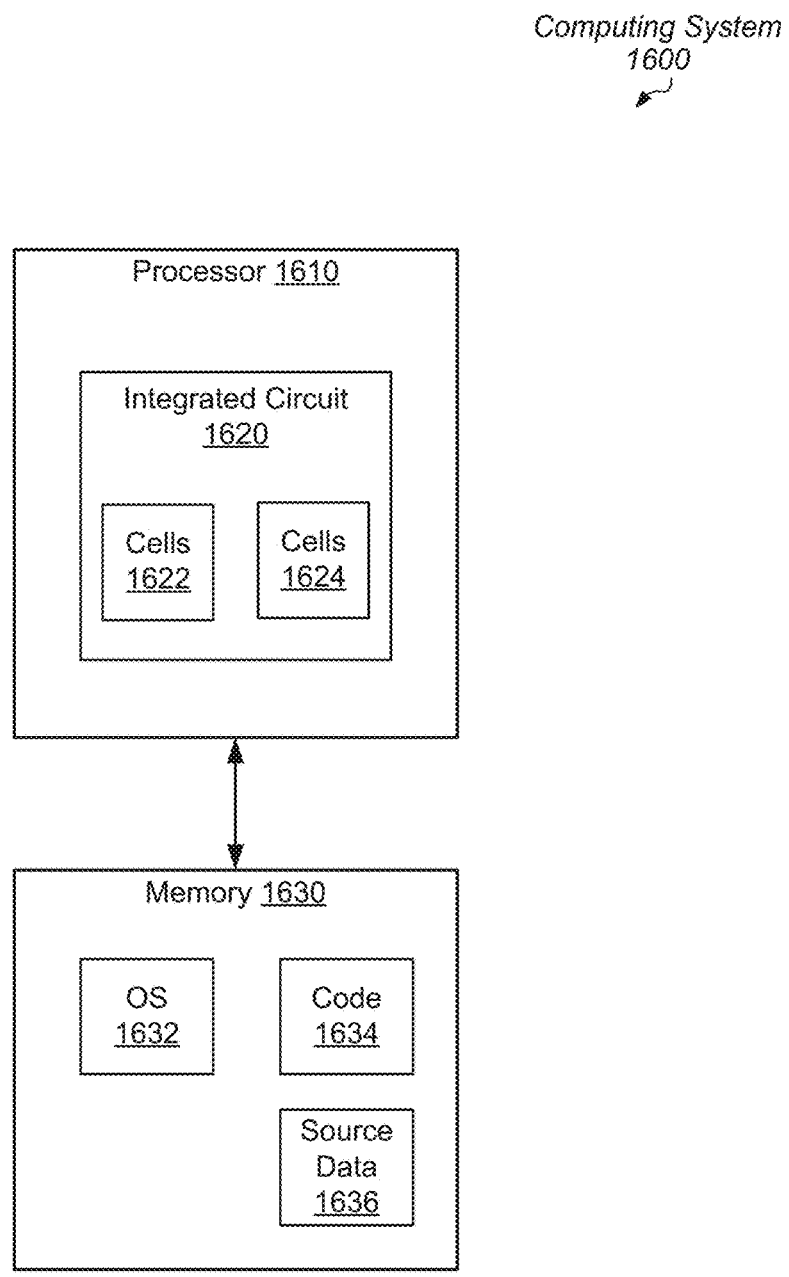
FIG. 16 is a generalized diagram of computing system with an integrated circuit that uses standard cells that utilize Cross FETs.

Referring to FIG. 16, one embodiment of a computing system 1600 is shown. The computing system 1600 includes the processor 1610 and the memory 1630. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 1600 includes one or more of other processors of a same type or a different type than processor 1610, one or more peripheral devices, a network interface, one or more other memory devices, and so forth. In some implementations, the functionality of the computing system 1600 is incorporated on a system on chip (SoC). In other implementations, the functionality of the computing system 1600 is incorporated on a peripheral card inserted in a motherboard. The computing system 1600 is used in any of a variety of computing devices such as a desktop computer, a tablet computer, a laptop, a smartphone, a smartwatch, a gaming console, a personal assistant device, and so forth.

The processor 1610 includes hardware such as circuitry. For example, the processor 1610 includes at least one integrated circuit 1620, which utilizes Cross FETs for implementing standard cells. For example, the integrated circuit includes at least a first category of cells 1622 where each of the two devices in a particular vertical stack receive a same input signal. Another category of cells 1624 includes at least one pair of devices in a particular vertical stack where each device in the pair receives a different input signal. The cells 1624 have a larger height dimension than the cells 1622 due to having a gate region of a transistor in the pair with an extended gate region to complete internal connections within a corresponding cell. These cells use layout techniques described earlier.

In various implementations, the processor 1610 includes one or more processing units. In some implementations, each of the processing units includes one or more processor cores capable of general-purpose data processing, and an associated cache memory subsystem. In such an implementation, the processor 1610 is a central processing unit (CPU). In another implementation, the processing cores are compute units, each with a highly parallel data microarchitecture with multiple parallel execution lanes and an associated data storage buffer. In such an implementation, the processor 1610 is a graphics processing unit (GPU), a digital signal processor (DSP), or other.

In some implementations, the memory 1630 includes one or more of a hard disk drive, a solid-state disk, other types of flash memory, a portable solid-state drive, a tape drive and so on. The memory 1630 stores an operating system (OS) 1632, one or more applications represented by code 1634, and at least source data 1636. Memory 1630 is also capable of storing intermediate result data and final result data generated by the processor 1610 when executing a particular application of code 1634. Although a single operating system 1632 and a single instance of code 1634 and source data 1636 are shown, in other implementations, another number of these software components are stored in memory 1630. The operating system 1632 includes instructions for initiating the boot up of the processor 1610, assigning tasks to hardware circuitry, managing resources of the computing system 1600 and hosting one or more virtual environments.

Each of the processor 1610 and the memory 1630 includes an interface unit for communicating with one another as well as any other hardware components included in the computing system 1600. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
a first cell comprising:
a first pair of transistors with channels of different doping polarities, including a first transistor with a first doping polarity, configured to receive a same input signal; and
a second pair of transistors with channels of different doping polarities, including a second transistor with the first doping polarity, configured to receive two different input signals, wherein the second transistor has a gate region length that is greater than a gate region length of the first transistor;
wherein responsive to a potential being applied to an input node of the integrated circuit, a current is conveyed from the input node to an output node of the integrated circuit through the first cell.

2. The integrated circuit as recited in claim 1, wherein transistors of the first pair of transistors and the second pair of transistors that have a second doping polarity different than the first doping polarity have gate regions physically connected to one another.

3. The integrated circuit as recited in claim 1, wherein each of the of the first pair of transistors and the second pair of transistors consumes an area on a silicon substrate of a single transistor.

4. The integrated circuit as recited in claim 3, wherein the first pair of transistors comprises:
a third transistor comprising a first channel oriented in a first direction;
an oxide layer adjacent to the first transistor; and
the first transistor adjacent to the oxide layer, wherein the second transistor comprises a second channel that is oriented in a direction orthogonal to the first direction.

5. The integrated circuit as recited in claim 4, wherein:
a channel comprises a nanosheet; and
each of the third transistor and the first transistor is a vertical gate all around (GAA) device.

6. The integrated circuit as recited in claim 1, further comprising a second cell comprising:
a third pair of transistors with channels of different doping polarities configured to receive a first input signal by each transistor of the third pair of transistors; and
a fourth pair of transistors with channels of different doping polarities configured to receive a second input signal by each transistor of the fourth pair of transistors, wherein each transistor of the third pair of transistors and the fourth pair of transistors has a same length of a gate region.

7. The integrated circuit as recited in claim 6, wherein a height of the first cell is greater than a height of the second cell.

* * * * *

UNITED STATES PATENT AND TRADEMARK OFFICE
CERTIFICATE OF CORRECTION

PATENT NO. : 11,881,393 B2
APPLICATION NO. : 17/489316
DATED : January 23, 2024
INVENTOR(S) : Richard T. Schultz It is certified that error appears in the above-identified patent and that said Letters Patent is hereby corrected as shown below:

On the Title Page

Item (73) Assignee:
Line 1, please delete "Advanced micro devices, inc." and insert -- Advanced Micro Devices, Inc. --.

Signed and Sealed this
Seventh Day of May, 2024

Katherine Kelly Vidal
*Director of the United States Patent and Trademark Office*